United States Patent [19]

Parr et al.

[11] Patent Number: 4,997,674

[45] Date of Patent: Mar. 5, 1991

[54] CONDUCTIVE METALLIZATION OF SUBSTRATES VIA DEVELOPING AGENTS

[75] Inventors: William J. E. Parr, Naperville, Ill.; Ronald E. Hutton, Faversham, England; Paul Y. Y. Moy, Des Plaines, Ill.; Dieter Frank, Naperville, Ill.; David A. Strawser, Prospect Heights, Ill.

[73] Assignee: Akzo America Inc., New York, N.Y.

[21] Appl. No.: 204,068

[22] Filed: Jun. 6, 1988

Related U.S. Application Data

[63] Continuation-in-part of Ser. No. 68,593, Jun. 30, 1987, abandoned.

[51] Int. Cl.$^5$ ............................................. C23C 24/00
[52] U.S. Cl. ................................... 427/123; 427/337; 427/367; 427/371; 427/370; 427/383.1
[58] Field of Search ............... 427/123, 337, 367, 371, 427/383.1, 370

[56] References Cited

U.S. PATENT DOCUMENTS

| | | | |
|---|---|---|---|
| 3,596,842 | 6/1986 | Chung | 523/415 |
| 4,064,074 | 12/1977 | Ellis | 252/511 |
| 4,232,060 | 11/1980 | Mallory | 427/305 |
| 4,382,981 | 5/1983 | Stoetzer et al. | 427/105 |
| 4,508,640 | 4/1985 | Kanda | 524/441 |
| 4,572,843 | 2/1986 | Saito | 427/79 |
| 4,590,115 | 5/1986 | Cassat | 427/437 |
| 4,614,837 | 9/1986 | Kane | 427/123 |
| 4,663,240 | 5/1987 | Hajdu | 427/123 |
| 4,681,712 | 7/1987 | Sakakibara | 427/25 |
| 4,786,570 | 11/1988 | Yu | 430/64 |
| 4,795,660 | 1/1989 | Cooray | 427/123 |
| 4,799,996 | 1/1989 | Cassat | 164/138 |

FOREIGN PATENT DOCUMENTS 0170063 2/1986 European Pat. Off. .

OTHER PUBLICATIONS

Derwent Abstract 84-176031, Matveeva, 11/07/83.

*Primary Examiner*—Shrive Beck
*Assistant Examiner*—Vi Duong Dang
*Attorney, Agent, or Firm*—Louis A. Morris

[57] ABSTRACT

A conductive metal layer is formed on a substrate by depositing copper or nickel particles on the substrate, contacting the metal particles with a specified developing agent, and heating the metal particles and the developing agent. The coated substrates have conductive surfaces and are useful for a variety of uses such as EMI shielding and printed circuit boards.

36 Claims, No Drawings

CONDUCTIVE METALLIZATION OF SUBSTRATES VIA DEVELOPING AGENTS

RELATED APPLICATIONS

This application is a continuation in part of Ser. No. 068,593, filed 1987 June 30, now abandoned.

BACKGROUND OF THE INVENTION

This invention relates to the formation of a conductive layer of metal on a substrate. In particular, this invention relates to such a process wherein the conductive layer is formed from discrete metal particles of copper or nickel, and a chemical developing agent is employed.

It is frequently desired to form a layer of conductive metal on a (generally) non-conductive substrate. Such composites are useful for printed circuit boards, electromagnetic interference (EMI) shielding, and so forth.

Japanese publication JP 110704(84) (shin Gijutsu Kaihat) reports that a conductive layer may be formed on a substrate by spraying super fine (e.g.: 0.2 um) metal particles with the aid of a carrier gas (e.g.: nitrogen or argon) onto a substrate, followed by low temperature (e.g.: 80° C.) sintering. One significant disadvantage of this process is the limited availability of such fine metal dust. Further, the use of metal dust in an air spray system requires extensive hygienic safeguards.

Japanese publication JP 66133(73) (Fujimori Kogyo) and DE 2,163,118 (Fujimori Kogyo (Sakai)) both describe a process where metal particles are mixed with a binder, applied to a substrate, dried, and treated with an agent which is an acid, a halogen, or a halogenide. Such processes are inconvenient and damaging to equipment in their requirement for a binder and a corrosive agent.

GB 2,085,340 teaches a paint containing copper particles and optionally a wetting agent (Preferably triethanolamine), which is useful for producing conductive coatings. It has not teaching of a conductive layer in the absence of a binder.

US 4,434,084 (Dupont (Hicks)) and DE 2,411,988 (Dupont (Beske)) both describe processes wherein a mixture of copper and tin particles are coated on a substrate with the air of chemical activators and heat sufficient to melt the tin. In the U.S. Pat. the chemical activators are an organic acid flux and an organic amine in an inert organic medium. In the German publication the chemical activator is a flux which may contain triethanolamine as an adjuvant. Both patents require the formation of an intermetallic compound ($Cu_3Sn$), and neither patent teaches the use of an amine in the absence of another agent.

SUMMARY OF THE INVENTION

In one aspect the invention is a method of forming a conductive metal layer on a substrate in which the metal particles are deposited on the substrate, contacted with a developer, and heated (not necessarily in the stated order).

In another aspect the invention is a coated substrate made by the above method.

The method of the invention is convenient to carry out, involves relatively non-corrosive materials, and produces well adhered, very conductive metal coatings on substrates.

DETAILED DESCRIPTION OF THE INVENTION

One element of the invention is the use of nickel or copper particles. In general, any nickel or copper which is in the form of a powder is suitable for use in the invention. While not critical, the use of a plate-shaped (lamellar) metal particle is preferred. However, excellent results have been obtained with spherical particles. Of more importance is the particle size of the nickel or copper. The principal difficulty with large particles seizes is that of obtaining a uniform distribution of particles on the substrate and ensuring adequate particle-to-particle contact in a relatively thin metal layer. Generally, the particle size will be below 30, preferably below 20, and more preferably below 10 $\mu$m.

The copper or nickel need not be particularly pure and in fact significant amounts (eg up to 70%) of oxides of copper may be present. Further, mixtures of copper or nickel with other metals may be used. When mixtures are used, the mixture is desirably at least 40, more desirably at least 50, preferably at least 60, and most preferably at least 70 weight % cooper and/or nickel. A mixture of 60–80% copper and 20–40% aluminum will yield a conductive surface with an attractive silver-colored appearance.

The metal particles are deposited on a substrate. Suitable substrates include virtually any material which is capable of temporarily being in a relatively soft, deformable state so as to be able to provide adherence of the metal powder to its surface and is capable of being in a relatively hard, nondeformable state so as to be able to provide a relatively undisturbed layer of metal after the metal has become adhered. Thus, materials such as glass, natural resins (eg: unvulcanized natural rubber), and synthetic resins are suitable, with synthetic resins being preferred.

For purposes of the invention, suitable synthetic resins may be divided into two categories; thermoplastic resins and uncured resins. Thermoplastic resins are typically employed by applying the metal powder to the surface of the resin, heating the resin to a temperature such that it is so softened that the metal particles can be embedded into the surface of the resin, and cooling to ambient temperature. "Uncured" resins are typically employed by providing them in a completely uncured or semi-cured state (sufficiently uncured that the metal particles can adhere to the surface), applying the metal particles to the surface of the resin, and curing the resin to cause it to harden.

Suitable thermoplastic resins include polyolefins such as polypropylene and polybutadiene (polyethylene does not work very well, presumably because of its resistance to surface wetting); halogenated polyolefins such as polyvinlidenedifluoride (PVDF) (polytetrafluoroethylene (PTFE) does not work well because it will not flow even at temperatures that cause it to degrade); styrenics such as polystyrene, high impact polystyrene (HIPS), acrylonitrile butadiene-styrene (ABS), and styrene-acrylonitrile (SAN); acrylics such as polymethylmethacrylate (Plexiglass); polyaryl ethers such as polyphenylene oxide (Noryl); polyaryl sulfides such as polyphenylene sulfide (Ryton); polyesters such as polyethyleneterephthalate (PET) and polybutylene-terephthalate (PBT); polycarbonates (Lexan); polyamides such as nylon 6 (nylons are difficult to use because of their rapid change from solid to non-viscous liquid); polyetherimides (PEI) (Ultem); and polyethersulfones (PES) (Victrex), polyetheretherketones (PEEK), polyetherketones (PEK), polyarylates, polysulfones, polyarylsulfones, liquid crystaline polymers, and thermoplastic polyimide resins.

Thermoplastic resins which soften at temperatures of about 200° C. and above represent a special class of thermoplastic resins which are unusual in that in the absence of a developing agent they will yield a fairly conductive metal layer. Representative of such high softening-point resins are polyethersulfones (PES), polyetherimides (PEI), polyetheretherketones (PEEK), polyetherketones (PEK), polyarylates, polysulfones, polyarylsulfones, liquid crystaline polymers, and thermoplastic polyimide resins. It may be noted that a common feature of such resin is a high degree of aromatic linking units. The presence of such structure commonly produces polymers which have high glass transition temperatures and flow temperatures above 200° C. In general, in this embodiment, it is desirable to have, in the repeating units of the polymer, at least 40%, desirably at least 50%, and more desirably least 60% of the carbon atoms being aromatic carbon atoms. Although these resins produce conductive layers in the absence of a developing agent, the use of a developing agent can, however, improve the conductivity of that layer. The preparation of such conductive substrates in more fully described in co-pending application Ser. No. 07/204,044, now abandoned, commonly assigned titled Conductive Metallization of Substrates Without Developing Agents, of even filling date herewith, which is incorporated herein by reference.

Exemplary "uncured" resins include thermoset resins such as epoxy, unsaturated polyester, and silicone rubber. Other uncured (or semi-cured) resins such as UV cure, electron beam cure, and ionizing radiation cure resins may also be employed. The presence of the metal layer, however, means that curing by these means could only take place from the uncoated side of the resin.

The substrates are illustratively in the form of thin (eg: 0.5 to 1 mm) sheets but other forms (eg: cubes, spheres, etc.) would be suitable. The substrates may be selected from the usual commercial grades of available materials, and no special handling or treatment is required. Although the surface to be coated should be relatively free of dirt and grease, cleaning steps are not required unless the substrate has been subjected to an unusual amount of surface contamination.

It is a requirement of the invention that the metal particles are contacted with a developing agent. Suitable developing agents include tertiary amines, tertiary phosphorous compounds, and bifunctional compounds having both (a) a first atom which is a trivalent nitrogen or a bivalent sulfur an d(b) at least one second atom which is nitrogen or oxygen, the first and second atoms being separated by at least two other atoms (preferably carbon); the bifunctional compound (1) being capable of forming a coordination complex (preferably a chelation complex) with copper or nickel. It is preferred that the developing agents be of sufficiently high molecular weight that evaporation of the developing agent at the developing temperature does not interfere with the process of the invention. Generally, a molecular weight of at least 150 is preferred and a molecular weight of at least 250 is more preferred. Very low molecular weight compounds may also have a tendency to pit the substrate.

Exemplary tertiary amines include long-chain aliphatic tertiary amines such as methyldicocoamine and dimethylcocoamine, and tertiary amines which may contain a degree of unsaturation such as dimethyltallowamine.

Tertiary amines can be generated in situ by the use of a quaternary ammonium salt, provided that the developing temperature is sufficiently high that the salt thermally degrades to a tertiary amine. Thus, compounds such as dicocodimethylammonium chloride and N,N,N',N',N'- pentamethyl-N-tallow-1,3-propanediammonium dichloride may be used for in situ generation of tertiary amines. This approach has the drawback, however, that the counter ions (eg: chloride ions) can cause corrosion.

Suitable tertiary phosphorous compounds (P (III) compounds) include tertiary phosphines such as triphenylphosphine (triphenylphosphorous, $(C_6H_5)_3P$) and tertiary phosphites such as tributyl phosphite $(CH_3(CH_2)_3O)_3P$.

Suitable bi-functional compounds include alkanolamines such as 2-hydroxyethylamine, 3-hydroxypropylamine, 4-hydroxybutylamine, 6-hydroxyhexylamine, and 2-hydroxy-1-ethylethylamine; aromatic hydroxy amines such as ortho-aminophenol; diamines such as N-methyl-1,2-diaminoethane; secondary amino alcohols such as diethanolamine, N-methylethanolamine, N-tert butyl ethanolamine, and N,N'-diethanolethylenediamine; tertiary amino alcohols such as triethanolamine, N,N-bis (2-hydroxyethyl)cocoamine, and N,N-bis(2-hydroxyethyl)tallowamine; primary amines such as N-acetyl ethylene diamine; tertiary amides such as bis-[N,N-2-hydroxyethyl] dodecanamide and bis-[N,N-2-hydroxyethyl]formamide; secondary sulfides such as bis-[2-hydroxyethyl]sulfide and dilaurylthiodipropionate; hydrazides such as oxalic acid bis[cyclohexylidene hydrazide] (also known as Cuprizon 1) and salicyl hydrazide; hydrazones such as salicyl hydrazone; and oximes such as salicylaldoxime.

In selecting a suitable bifunctional compound it is important to realize that the minimum 2 atoms which must separate the two functional atoms also represents the preferred maximum number of interposed atoms. Thus, it is desirable that not more than 6, more desirable that no more than 5, preferred that no more than 4, more preferred that no more than 3, and most preferred that 2 atoms separate the two functional atoms. In molecules with limited flexibility about the bonds (eg: in aromatic structures) even three intervening atoms will cause the molecule to have little activity or none at all. In determining whether or not a compound is a bifunctional compound according to the invention (ie: meets the requirement of being able to form a coordination complex), a useful guide is the theoretical minimum intramolecular distance between said first and second atoms. This distance is generally less than 0.48 nm, desirably less than 0.40 nm, more desirably less than 0.35 nm, preferably less than 0.30 nm, and most preferably less than 0.29 nm.

The metal particles are deposited on the substrate by any means which will achieve a layer of particles sufficiently uniform that a conductive surface can be achieved. A preferred method of deposition is to spray a dilute suspension (about 5-15 weight % metal) of the meal in a volatile organic solvent such as dichloromethane. For this purpose, ordinary spray equipment such as used for painting may be employed.

Another preferred method is to coat the metal particles onto a transfer plate (such as an aluminum plate, by spraying or other means, and then pressing that plate onto the surface of the substrate. The transfer plate is also preferably used as the molding plate (discussed further below). If the transfer plate has been milled or etched to form a raised pattern, then the metal particles will form the mirror image of that pattern on the substrate.

A mask can be used to form a pattern when metal is deposited by the direct spray method or the transfer plate method. Other methods of application such as roller coating, electrostatic coating, fluidized bed coating, and so forth may also be used.

The metal particles are contacted with the developing agent by any convenient means. One simple means is to spray a liquid developer or a solution of a solid developer onto the metal particles after they are deposited on the substrate. Another method is to blend the developing agent with the material used to form the substrate. This latter method is particularly convenient for high volume application since it is often easier to compound an additive into resin than to provide a spray apparatus to coat all of the metal deposited onto the substrates. Developers with a beta-hydroxyethyl group will have an increased tendency to migrate to the polymer surface, and are therefore preferred in this variation. I should also be noted that some developers will cause some resins to become brittle and unworkable. Another method for contacting the metal with the developing agent is the use of the developing agent as a component of the solvent system used to spray the metal particles or using the developing agent in place of an inert solvent. In another method a volatile developer can be evaporated and the gas used to develop the metal in the absence of air.

The developer should be present in an effective amount. This is, an amount sufficient to render the metal particles conductive. Typically, the developer will be present at 1 to 200, desirably, 2 to 100, preferably 10 to 75, and more preferably 25 to 50 weight percent, based on the weight of the metal. The higher ends of the ranges will usually be necessary when the developer is incorporated into the substrate.

When a solid substrate (eg: a thermoplastic resin) is used as the substrate, it is generally necessary to induce adhesion of the metal particles to the substrate. To achieve desirable levels of adhesion of the metal, the coated substrate is desirably subjected to heat and pressure.

One function of the heat and pressure is to cause the particles to physically become embedded in the substrate. The heat required is that which is sufficient to cause enough softening of the substrate that the metal particles can be forced into the surface of the substrate. Obviously, the temperature at which the substrate softens will vary considerably depending on the substrate chosen. Some substrates will soften at relatively low temperatures (eg: polypropylene which can be molded at 150° C.) while others will need very high temperatures (eg: polyphenylene sulfide which requires 280° C.). Molding temperature for a number of specific substrates are presented in the Examples. The glass transition temperature (Tg) of a substrate is a useful guide for choosing a molding temperature. Molding temperatures are typically higher than the glass transition temperature of the substrate. If the molding temperature is too low, there will be insufficient flow of the substrate and lack of adequate adhesion. If the temperature is too high, the substrate will melt and perhaps degrade. Simple trial and error can easily determine the optimum molding temperature for any substrate.

Pressure is used in addition to heat to physically push the particles into the softened substrate. The pressure also serves to exclude oxygen from the metal particles. If pressure is not used, another oxygen-excluding mechanism, such as heating in an inert atmosphere, must be used. The amount of pressure is not critical, and depends mainly on the degree of softening of the substrate at the molding temperature. Typically molding pressures of about 5–100 MPa will be suitable.

The pressure may be provided by any conventional press and for mass production a roll press may be advantageous. There is no minimum time for maintaining the pressure, except that if the pressing surface is also the heat source, then pressure must be maintained for a sufficient length of time to allow the substrate to reach the molding temperature.

In a preferred embodiment, a solution of polymer is cast onto the surface of a base substrate and the metal powder applied to its surface while it is still tacky. The base substrate may optionally be removed after the solvent is fully evaporated. In a related preferred embodiment a substrate is contacted with a solvent such that its surface becomes tacky enough to cause the metal particles to become adhered.

In the case of semicured or uncured resins the application of heat is usually not required for (and in fact may hinder) the molding process. Since the resins are generally quite tacky, the use of pressure is generally not required to push the particles into the resin surface. For thermoset resins, heat will be necessary after the metal is applied to cure the resin.

Whether or not heat is used to aid the adhesion of the metal to the substrate, heat is necessary to activate the developing agent. The temperature needed for activation can vary with the particular developer chosen. Generally, a temperature of 150 to 400° C., preferably 180 to 230° C., and more preferably 200 to 220° C. is required for activation.

If the developing agent is applied to the metal layer prior to molding, then the heating for molding and the heating for developing can be a single heating step, provided that the temperature is sufficiently high for each process.

Alternatively a coated substrate with the developer present can have the molding take place at a low temperature (eg: polypropylene at 150° C.) with the developing being a separate step at a higher temperature. However, the fact that the developing must take place in the absence of oxygen makes this 2-stage approach inconvenient to carry out. Conducting the molding and developing simultaneously is advantageous because one of the effects of the molding plates i the exclusion of oxygen.

In a preferred embodiment, the metal particles are contacted with the developing agent and subjected to heat, prior to being deposited on the substrate. This embodiment is advantageous in that some resins will degrade at the temperatures required for developing, and this method isolates the resin from the developing heat. It is further advantageous in that it is particularly adaptable to mass production techniques.

The metallized substrates of the invention are useful in a wide variety of applications including printed circuit boards, EMI shielding, capacitors, battery plates, electrical switches, and decorative panels.

The following examples are set forth to further explain the invention. In the Tables in the examples, "—" means that the resistance of the sample was $\geq 7$ Megaohms/square.

EXAMPLE 1a (Comparative)

This example illustrates that good adhesion, but very poor (low) conductivity, can be achieved in the absence of a suitable developing agent. A preformed plaque of high-impact polystyrene (HIPS) about $3'' \times 4'' \times 0.03''$ thick ($76 \times 102 \times 0.76$ mm) was sprayed with a suspension of copper powder in dichloromethane and dried in an oven at 55° C. (to evaporate the solvent completely). The copper applied weighted about 0.3 g and exhibited slight adhesion to the plastic as a result of solvent swelling of the surface during spray up. The coated preform could thus be manipulated without the coating falling off, but if the coating was rubbed the copper became detached. At this stage surface resistance of the coating was greater than $10^7$ ohms/square. The coated preform was then compression molded between chromed steel plates at 215° C. for 12 min under 5 tons/square inch (69 MPa) pressure. The molds were cooled in a second press to 20° C. and the plastic removed. The copper powder had become compressed into the surface of the plastic (since the molding was done at above temperature at which the polymer became fluid) to form a well adhered continuous copper layer. This layer was orange in color and had a surface resistance of greater than $10^6$ ohms/square.

EXAMPLE 1b

This example illustrates that by spraying suitable developing agent onto a copper powder coating prior to molding a high conductive copper layer is obtained.

A HIPS preform was sprayed with copper powder as in Example 1a, dried, and then sprayed with a 5% solution of N,N-bis 2-hydroxyethyl)cocoamine in dichloromethane so as to afford a 3:1 weight ratio of Cu:amine after drying in an oven at 55° C. to evaporate the solvent. The coated preform was compression molded as in Example 1a. After development the well-adhered copper coating was pink in color and possessed a surface resistance of 0.01 ohms/square. The use of the developing agent thus improved the conductivity by a factor of $10^8$.

EXAMPLE 1c

In this example it is shown that is also possible, by application of a suitable developing agent, to convert a well-adhered, but non-conductive, copper coating to high conductivity.

A HIPS preform which had been sprayed with copper powder and molded as in Example 1a to afford a non-conductive coating was sprayed with a 5% solution of N,N-bis-(2-hydroxyethyl)cocoamine in dichloromethane. After drying to remove solvent the plaque was compression molded for 12 min at 215° C. under 5 tpsi (69 MPa) pressure. After cooling, the surface appearance of the copper coating had been changed from orange to pink in color and the surface resistance improved from greater than $10^6$ to less than 1 ohm/square.

EXAMPLE 2

In this example it is demonstrated that it is possible to combine the spray-up of the metal and the developer into a single stage.

A HIPS preform was sprayed with dichloromethane containing 10% by weight of copper powder and varying weight percentages of N,N-bis(2-hydroxyethyl)tallowamine. After drying to evaporate solvent, the plaque was compression molded for 15 min at 200° C. under 5 tpsi (69 MPa) of pressure. After cooling the plaque was found to bear a well adhered, highly conductive layer of copper.

| Weight % amine in $CH_2Cl_2$/Cu Spray | Surface Resistance (ohm/sq) |
|---|---|
| 1.0 | 0.01 |
| 2.5 | 0.01 |
| 5.0 | 0.01 |
| 10.0 | 0.71 |

This example illustrates that the process of the invention may be carried out successfully by incorporation of the developing agent into the polymer (by conventional processing methods such as mising on a 2-mill, or extrusion) prior to its fabrication and treatment with metal powder. Data are shown in Table A for various developing agents compounded into HIPS, ABS and polypropylene plastics. After spraying the metal powder suspended in dichloromethane, onto the surface of the plastic resin containing the developer, the samples were compression molded for 12 min at 215° C. under 5 tpsi (69 MPa) pressure. In Table A, some of the long aliphatic chains represent the nominal length of a chain which comes from a natural source having a distribution of aliphatic chains.

TABLE A

In-resin developers: Moulded 215° C. for 12 min under 5 tpsi (69 MPa) after spraying metal powder in dichloromethane onto surface

| Metal | Resin | Sample | Developer | Level (wt %) | Metal:Developer wt ratio | | | Surface Resistance (1) (ohm/sq) | | |
|---|---|---|---|---|---|---|---|---|---|---|
| Cu | HIPS | 1 | cocoamine | 2 | 0.7 | 1.3 | | 6M | 7M | |
| | | 2 | dicocoamine | 2 | 0.9 | 1.3 | | — | — | |
| | | 3 | methyldicocoamine | 2 | 0.8 | 2.0 | 2.9 | 0.9 | 0.06 | 0.1 |
| | | 4 | methyldicocoamine | 1 | 1.2 | 2.5 | | 9.5 | 1.5 | |
| | | 5 | methyldi(hydrogenated)tallowamine | 2 | 1.1 | 2.0 | | 10k | 13.5 | |
| | | 6 | dimethylcocoamine | 2 | 1.0 | 1.9 | 2.6 | 0.1 | 0.04 | 0.1 |
| | | 7 | dimethyltallowamine | 2 | 1.0 | 2.1 | 2.9 | 0.2 | 0.01 | 0.1 |
| | | 8 | triethanolamine | 2 | 1.0 | 2.0 | | 0.01 | 0.01 | |
| | | 9 | N,N-bis(2-hydroxyethyl)cocoamine | 2 | 1.0 | 2.0 | | 0.03 | 0.01 | |
| | | 10 | N,N-bis(2-hydroxyethyl)cocoamine | 1 | 1.0 | 1.9 | 3.1 | 0.37 | 0.6 | 0.4 |
| | | 11 | N,N-bis(2-hydroxyethyl)cocoamine | 0.5 | | 2.1 | | | 0.23 | |
| | | 12 | polyoxyethylene(15)tallowamine | 2 | | 2.2 | 3.5 | 18k | 280 | |
| | | 13 | polyoxyethylene(50)octadecylamine | 2 | 1.6 | 2.9 | | 88k | 300k | |
| | | 14 | dicocodimethylamonium chloride | 2 | 1.5 | 2.0 | 3.2 | 1k | 0.3 | 2.0 |

TABLE A-continued

In-resin developers: Moulded 215° C. for 12 min under 5 tpsi (69 MPa) after spraying metal powder in dichloromethane onto surface

| Metal | Resin | Sample | Developer | Level (wt %) | Metal:Developer wt ratio | | | Surface Resistance (1) (ohm/sq) | | |
|---|---|---|---|---|---|---|---|---|---|---|
| | | 15 | N,N',N'-pentamethyl-N-tallow-1,3-propanediamonium chloride | 2 | 1.4 | 2.3 | 3.3 | — | 4k | 101 |
| | | 16 | dimethylcocoamine oxide | 2 | 1.2 | 2.0 | 3.0 | 4k | 7M | 40k |
| | | 17 | bis(2-hydroxyethyl)dodecanamide | 2 | | 2.1 | 3.1 | | 3.3 | 0.52 |
| | | 18 | phenyl di isodecyl phosphite | 2 | 1.0 | 2.1 | 2.9 | — | — | — |
| | | 19 | triphenyl phosphine | 2 | 1.3 | 1.8 | 3.1 | 2M | 2M | 11.9 |
| Cu | ABS | 20 | N,N-bis(2-hydroxyethyl)cocoamine | 2 | 1.1 | 2.4 | | 0.05 | 0.07 | |
| | | 21 | N,N-bis(2-hydroxyethyl)cocoamine | 1 | 1.6 | 2.5 | 3.6 | 3M | 1.2 | 6.2 |
| | | 22 | N,N-bis(2-hydroxyethyl)cocoamine | 0.5 | | 2.3 | 3.3 | | 200k | 50k |
| CU | PP | 23 | N,N-bis(2-hydroxyethyl)cocoamine | 2 | 1.1 | 2.2 | | 0.2 | 0.1 | |
| | | 24 | N,N-bis(2-hydroxyethyl)cocoamine | 1 | | 1.8 | 3.1 | | 0.9 | 0.5 |
| | | 25 | N,N-bis(2-hydroxyethyl)cocoamine | 0.5 | | | 3.9 | | | 2.0 |
| | | 26 | N,N-bis(2-hydroxyethyl)tallowamine | 2 | 1.0 | 2.4 | | 0.6 | 0.04 | |
| | | 27 | N,N-bis(2-hydroxyethyl)tallowamine | 1 | 1.3 | 2.5 | | 0.9 | 0.1 | |
| | | 28 | N,N-bis(2-hydroxyethyl)tallowamine | 0.5 | 1.2 | | 3.1 | 10M | | 100k |
| Ni | HIPS | 29 | N,N-bis(2-hydroxyethyl)cocoamine | 2 | 1.4 | 2.3 | 6.1 | 2.7 | 0.22 | 0.04 |
| | | 30 | N,N-bis(2-hydroxyethyl)cocoamine | 1 | | | 3.8 | | | 0.7 |
| | | 31 | N,N-bis(2-hydroxyethyl)cocoamine | 0.5 | | | 3.8 | | | 9.4 |

(1) "—" means to resistance was ≧7 Megaohms/square.

EXAMPLE 4

The following examples illustrate the principle of transfer molding as applied to the process of the invention.

A. A piece of aluminum foil, 0.002" (0.051 mm) thick was sprayed with a suspension of copper powder in dichloromethane and then the copper coated side placed in contact with a 1 mm thick ABS plastic preform which had been compounded on a 2-roll mill to incorporate 4% N,N-bis(2-hydroxyethyl)cocoamine. The assemblage was then compression molded for 12.5 min at 220° C. under 5 tpsi (69 Mpa) pressure. After cooling the aluminum foil could be easily peeled from the surface of the ABS. The copper was found to have been cleanly transferred to the surface of the polymer where a continuous, lustrous highly conductive and well-adhered layer of metal had been formed.

B. A similar experiment was performed in which aluminum foil cut to varying widths of ¼" to 0/06" (6.3–1.5 mm) was sprayed with copper and molded as above. Again the copper became conductive and well adhered to the ABS.

C. An experiment identical to (A) was performed but substituting steel shim-stock sprayed with copper for aluminum as the transfer medium. Again the ABS was found to bear a conductive copper layer.

D. A ¼" (6.3 mm) thick aluminum block was milled to produce a positive image of the circuit pattern required for a simple circuit based on the NE555 timer integrated circuit upon the raised portions. THis pattern piece was sprayed with copper powder in dichloromethane and then compression molded against a 0.03" (0.76 mm) thick HIPS preform, into which 2% N,N-bis(2-hydroexyethyl)cocoamine had been compounded, for 12.5 min at 215° C. under 5 tpsi (69 MPa) pressure. Upon cooling and separation of the pattern pieces it was found that the copper had been cleanly transferred from the aluminum to the HIPS to form a continuous, well adhered and highly conductive circuit pattern.

E. The aluminum pattern piece of (D) was sprayed with a suspension of copper powder in dichloromethane and then compression molded in contact with a 0.03" (0.76 mm) thick piece of polyetherimide for 10 min at 220° C. under 5 tpsi (69 MPa). By filling the hollow areas of the aluminum pattern piece with a Viton rubber filler of the appropriate thickness sagging of the PEI into these hollows could be prevented so that the PEI remained relatively flat after the transfer molding Upon cooling it was found that the copper powder had transferred from the aluminum to the surface of the PEI to form an orange circuit pattern. Corner to corner resistance over 5" (127 mm) or so of 3/16" (4.8 mm) wide track was around 100-200 ohms using 2 ohmmeter probes. Better adhesion of the metal (due to improved PEI fluidity) was obtained by molding at 240° C. but this produced some "flashing" (ie: oozing of the resin out of the mold).

F. An experiment was preformed as in (E) except that the mold temperature was 220° C. and the copper powder coated aluminum pattern was sprayed with a solution of N,N-bis-(2-hydroxyethyl)tallowamine in dichloromethane before the molding cycle. Again, after cooling, clean transfer of the copper to the PEI surface had occurred, but this time the corner to corner resistance over the same distance was reduced to 1 ohm (or better) using 2 ohmmeter probes, and the copper was a lustrous pink in color.

G. An experiment was performed as in (E) to give an orange circuit pattern upon the PEI with a corner to corner resistance of 100-200 ohms. The PEI/Cu patterned preform was then sprayed with a solution of N,N-bis (2-hydroxyethyl)-tallowamine in dichloromethane and then recompression molded between chrome-plated steel sheets.

TABLE D

List of Metallization Developers used on HIPS

| Chemical Class | Group | Sample | Compound | Surface (1) Resistance (ohm/square) |
|---|---|---|---|---|
| Nitrile | D | 1 | Coconitrile | — |
| Aldehyde | D | 2 | $C_{18}H_{37}CHO$ | — |
| Ester | D/E | 3 | $C_{12}H_{25}OOCCH$ | — |

TABLE D-continued

List of Metallization Developers used on HIPS

| Chemical Class | Group | Sample | Compound | Surface (1) Resistance (ohm/square) |
|---|---|---|---|---|
| Amine oxide | E | 4 | $C_{12}H_{25}N(O)(CH_3)_2$ | — |
| | B/E | 5 | $C_{12}H_{25}N(O)(CH_2CH_2OH)_2$ | — |
| Primary amine | A | 6 | $CH_3(CH_2)_{11}NH_2$ | — |
| | A | 7 | $CH_3OCH_2CH_2NH_2$ | — |
| | B | 8 | $HOCH_2CH_2NH_2$ | 0.01 |
| | B | 9 | $HO(CH_2)_3NH_2$ | 0.02 |
| | B | 10 | $HO(CH_2)_4NH_2$ | 0.4 |
| | B | 11 | $HO(CH_2)_6NH_2$ | 1 to 10M |
| | B | 12 | $HOCH_2CH(CH_2CH_3)NH_2$ | 0.01 |
| | B | 13 | $o\text{-}HOC_6H_4NH_2$ | 0.1 to 4.6 |
| | B | 14 | $m\text{-}HOC_6H_4NH_2$ | 10M |
| | B | 15 | $NH_2CH_2CH_2NH_2$ | 0.03 |
| | B | 16 | $NH_2(CH_2)_6NH_2$ | 1 to 10M |
| | B | 17 | $o\text{-}NH_2C_6H_4NH_2$ | 10M |
| | B | 18 | $m\text{-}NH_2C_6H_4NH_2$ | — |
| | B | 19 | $CH_3NHCH_2CH_2NH_2$ | 0.03 |
| | B | 20 | $CH_3CONHCH_2CH_2NH_2$ | 0.01 |
| | B | 21 | $(CH_3(CH_2)_{11})_2NH$ | — |
| | B | 22 | $NH(CH_2CH_2OH)_2$ | 0.05 |
| | B | 23 | $CH_3NHCH_2CH_2OH$ | 0.05 |
| | B | 24 | $(CH_3)_3CNHCH_2CH_2OH$ | 350 |
| | B | 25 | $(CH_2NHCH_2CH_2OH)_2$ | 0.01 |
| | B | 26 | $CH_3(CH_2)_3NHCH_2CH_2SH$ | — |
| | A | 27 | $CH_3(CH_2)_{11}N(CH_3)_2$ | 0.5 |
| | A | 28 | dimethyltallow amine | 1-5 |
| | A | 29 | $CH_3(CH_2)_{11})_2NCH_3$ | 0.8 |
| | A | 30 | $(CH_3)_2NCH_2CH_2N(CH_3)_2$ | 30 |
| | A/B | 31 | $N(CH_2CH_2OH)_3$ | 0.005 |
| | A/B | 32 | N,N-bis(2-hydroxethyl)cocoamine | 0.005 |
| | A/B | 33 | N,N-bis(2-hydroxyethyl)tallowamine | 0.01 |
| | A | 34 | $C_{17}H_{35}CONH_2$ | — |
| | A | 35 | $o\text{-}HOC_6H_4CONH_2$ | — |
| Secondary amide | B | 36 | $CH_3CONHCH_2CH_2OH$ | 10M |
| | B | 37 | $C_{12}H_{25}CONHCH_2CH_2OH$ | 10M |
| Tertiary amide | A | 38 | $C_{12}H_{25}CON(CH_3)_2$ | — |
| | A/B | 39 | $C_{12}H_{25}CON(CH_3)_2 + C_{12}H_{25}OH$ (1:2) | — |
| | B | 40 | $C_{12}H_{25}CON(CH_2CH_2OH)_2$ | 0.1 |
| | B | 41 | $HCON(CH_2CH_2OH)_2$ | 0.01 |
| Tertiary phosphine | B | 42 | $(C_6H_5)_3P$ | 100 |
| Tertiary phosphite | A | 43 | $(CH_3(CH_2)_3O)_3P$ | 0.1-15 |
| Sulfide | A | 44 | $(CH_3(CH_2)_{11})_2S)$ | — |
| | A | 45 | $(C_6H_5CH_2)_2S$ | — |
| | B | 46 | $S(CH_2CH_2OH)_2$ | 400 |
| | B | 47 | $S(CH_2CH_2COOC_{12}H_{25})_2$ | 500-10K |
| Hydrazide | B/C | 48 | $(cyclo\text{-}C_6H_{10}=NNHC(O))_2$ | 0.1-10K |
| | B/C | 49 | $o\text{-}HOC_6H_4CONHNH_2$ | 2 |
| Hydrazone | B/C | 50 | $o\text{-}HOC_6H_4CH=NNH_2$ | 0.03 |
| Oxime | C | 51 | $o\text{-}HOC_6H_4CH=NOH$ | 10K-100K |
| Hydroxamic | C | 52 | $o\text{-}HOC_6H_4CONHOH$ | — |

(1) "—" means the resistance was $\geq 7$ Megaohms/square.

Upon cooling the copper layer had turned pink and the corner to corner resistance lowered to 1 ohm (or better).

H. The PEI circuit board fabricated in (F) was drilled and a wire attached successfully by conventional soldering.

I. In a manner similar to (F) copper was transfer molded to a glass-filled modified polyphenylene oxide (Noryl) preform. Again a highly conductive circuit pattern was formed to which components (including resistors, capacitors, light-emitting diodes, and integrated circuit sockets) were soldered to assemble a functioning oscillator circuit based upon the NE555 integrated-circuit timer chip.

The above data demonstrate that the process of invention can be adapted to transfer molding on various polymers to give well-adhered, conductive patterns. The developing agent may be present during the transfer molding cycle (either in the polymer, or as a surface coating upon the metal powder) or may be used in a second separate developing step.

EXAMPLE 5

The following example demonstrates how optimization of the process of the invention for a given polymer/metal developer combination can be made.

For this work high-impact polystyrene preforms of varying thickness were utilized. These were sprayed with a suspension of copper powder in dichloromethane, dried, sprayed with a 10% solution of N,N-bis(2-hydroxyethyl)tallowamine in dichloroemethane, dried, and compression molded before assessment for conductivity. The molding was carried out either between two chromed steel plates separated by shims of the required thickness ("open mold") (Table B), or in a solid steel closed cavity mold (Table C).

TABLE B

OPEN MOLD

| Temp °C. | Time (min) | Pressure (tpsi) | (MPa) | Cu:dev wt ratio | Surface Resistance (ohm/square) |
|---|---|---|---|---|---|
| 180 | 12 | 5 | 69 | 3.6 | 0.15 |
| 180 | 10 | 5 | 69 | 2.3 | 0.44 |
| 180 | 8 | 5 | 69 | 2.7 | 1.83 |
| 180 | 6 | 5 | 69 | 2.3 | 10k-100k |
| 180 | 12 | 40 | 550 | 1.4 | 0.15 |
| 180 | 12 | 1 | 14 | 2.3 | 0.09 |
| 180 | 8 | 40 | 550 | 2.2 | 0.44 |
| 180 | 8 | 1 | 14 | 3.4 | 0.42 |
| 200 | 8 | 1 | 14 | 2.6 | 0.015 |
| 200 | 6 | 1 | 14 | 2.6 | 0.014 |
| 200 | 4 | 1 | 14 | 3.1 | 0.07 |
| 200 | 2 | 1 | 14 | 1.8 | — |
| 165 | 25 | 1 | 14 | 2.4 | 0.07 |

The above data indicates that for the HIPS/Cu/N,N-bis(2-hydroxyethyl)tallowamine combination in open molds the compression mold time required to obtain high conductivity may be altered from the usual 12 min/215° C. to 4 m in at 200° C., 9 min at 180° C., or even 25 min at 165° C. Moreover the data illustrates that the molding pressure exerts little effect upon the conductivity achieved.

TABLE C

CLOSED MOLD

| Temp °C. | Time (min) | Pressure (tpsi) | (MPa) | Cu:dev wt ratio | Wt Cu (g) | Surface Resistance (ohm/sq) |
|---|---|---|---|---|---|---|
| 180 | 25 | 1 | 14 | 2.2 | 0.26 | 0.19 |
| 180 | 25 | 1 | 14 | 2.9 | 0.38 | 0.04 |
| 180 | 25 | 1 | 14 | 3.5 | 0.22 | 0.05 |
| 180 | 25 | 1 | 14 | 5.0 | 0.31 | 1.13 |
| 180 | 25 | 1 | 14 | 7.1 | 0.38 | 0.04 |
| 180 | 25 | 1 | 14 | 8.0 | 0.32 | 0.11 |

These results indicate that when using N,N-bis-(2-hydroxyethyl)tallowamine as a spray-on developer in closed cavity molds the copper:developer ratio may be changed from the more usual 2:1 or 3:1 ratio to 7:1 without greatly influencing the conductivity of the metal surface obtained. The success of this change in ratio (i.e. the use of reduced amounts of developer) with closed molds in attributed to the reduced opportunity for escape of developer vapors during molding compared to the use of open molds and would be advantageous from an economic standpoint. In general with both open and closed cavity mods the best results were obtained by using a copper loading of around 25–35 mg per cm$^2$ of polymer surface; below this loading breaks in the coverage of the surface are generally observed whilst above the loading waste of the copper by way of adherence to the mold surface, is often observed. It was found that the use of closed cavity molds also prevented deformation of the preform and in general provided a more perfect and uniform metal surface.

EXAMPLE 6

This example illustrates the scope of the developing agents which may be employed in the process.

3"×4"×0.03" (76×102×0.76 mm) HIPS preforms were sprayed with a 10% suspension of copper powder, in dichloromethane, so as to give a 0.25–0.35 g weight of copper after solvent evaporation. A 5% solution of the developer in either dichloromethane or tetrahydrofuran was then sprayed onto the copper coating so as to give a 0.1–0.15 g weight of the developer after solvent evaporation. The coated preforms were then compression molded for 12 min at 215° C. under 5 tpsi (69 MPa) of pressure. After coating, the metallic surface layer was assessed for conductivity by the 4-probe method. Results are shown in Table D.

The samples in Table D are loosely classified by groups to aid in understanding the data therein. These somewhat arbitrary groupings are:

GROUP A Amines/P(III)/S(II) compounds without additional functionality; can undergo redox reaction only.

GROUP B Materials containing both a trivalent N or bivalent S, and a second N, O, or S atom; can undergo redox reaction and/or chelation.

GROUP C Materials known to be active metal chelators.

GROUP D Materials containing oxidizable or chelating functionality other than those defined in A, B, or C.

GROUP E Materials containing a tetravalent N or a function oxidized with difficulty.

It can be seen that for Group A (N(III), P(III), S(II) containing compound) conductive copper surfaces are only obtained when a nitrogen atom bears three alkyl groups (ie tertiary amine) or a phosphorous (III) atom bears no hydrogen atoms (tertiary phosphine, tertiary phosphite). Thus non additionally functionalized primary and secondary amines, primary, secondary and tertiary amides, and sulfides are inactive as developing agents for the process of the invention. Group A materials such as tertiary amines and phosphites, which are active developers probably owe their activity to a direct redox reaction with the oxide layer on individual copper (or nickel) particles (becoming oxidized, at least initially to amine oxide or P(V) respectively); only tertiary amines are readily oxidized to amine oxides.

From Table D it can be observed that materials in which a trivalent nitrogen atom is arranged three bonds distant from either a hydroxyl oxygen atom or a second amine nitrogen atoms (ie Group B material) function as developers for the process of the invention. Not only is the activity shown by a tertiary amine (eg dimethyl cocoamine) improved upon by the incorporation of beta-hydroxyethyl groups bonded to nitrogen (eg N,N-bis(2-hydroxyethyl)cocoamine); but more interestingly, compound types which are inactive developers in the absence of beta-hydroxyethyl groups bound to the N atom become active in the presence of such groups (compare $CH_3 OCH_2CH_2NH_2$ with $HOCH_2CH_2NH_2$, $C_{12}H_{25}CON(CH_3)_2$ with $C_{12}H_{25}CON(CH_2CH_2OH)_2$). A similar effect is seen when a beta-aminoethyl function is bonded to N, but not for a beta-mercaptoethyl function (compare $(CH_3(CH_2)_{11})_2NH$ with $CH_3CH_2CH_2NH_2$, $CH_3(CH_2)_3NHCH_2CH_2SH$). The presence of beta hydroxyethyl functionality bound to a bivalent sulfur atom also causes sulfides to exhibit increased developer activity (compare $S(CH_2CH_2OH)_2$ with $(C_{12}H_{25})_2S$); no developer activity was observed when beta-hydroxyethyl functions were bound to bivalent oxygen (eg: in $O(CH_2CH_2OH)_2$). The Table D data indicate that the same developer molecule should contain both functionalities (compare a 2:1 weight mixture of $C_{12}H_{25}CH:C_{12}H_{25}CON(CH_3)_2$ with $C_{12}H_{25}CON(CH_2CH_2CH)_2$; this implies that an intramolecular mechanism is important in any explanation of the developer activity peculiar to Group B materials.

Intramolecular complex formation between Group B materials and the metal as a partial explanation of their activity may also be drawn from a) the fall-off in developer activity as the number of bonds between N and O (or second N) centers increases, particularly when both are sterically constrained by a ring system (compare $NH_2(CH_2)_2OH$ with $NH_2(CH_2)_6OH$; $NH(CH_2)_2NH_2$ with $NH_2(CH_2)_6NH_2$; and $o\text{-}HOC_6H_4NH_2$ with $p\text{-}HOC_6H_4NH_2$ and b) the fall-off in activity when the nitrogen center is bound to a bulky substituent (compare $CH_3NHCH_2CH_2OH$ with $(CH_3)_3CNHCH_2CH_2OH$). It can also be seen from Table D that in the amine series only a single beta-hydroxyethyl or beta-aminoethyl group need be bonded to the nitrogen before developer activity is observed; this emphasizes that the presence of a basic nitrogen atom in the developing agent can increase developer activity.

Materials listed in Group C are well known to be capable of forming chelates with metals (including copper). Several materials such as salicylaldoxime exhibit moderate activity as developers for the process of the invention, but amongst Group C materials high activity is only observed from chelating agents which include both hydroxyl and —NH₂ functionality separated by 5 bond (eg salicylhydrazone, salicylaldoxime).

The data for materials which contain only easily oxidizable functionality or functionality capable of complexation to metals (ie Group D materials) clearly indicate that these abilities alone are not sufficient to effect the development of conductivity in the process of the invention.

Similarly materials, such as amine oxides, which contain a tetravalent nitrogen atom (Group E) do not function as active developing agents. This holds true even when such compounds contain two beta-hydroxyethyl groups attached to the tetravalent nitrogen atom (eg $C_{12}H_{25}N(O)(CH_2CH_2OH)_2$). This is an additional indication that stereochemical arrangement of the functionality within Group B materials is important in explaining their activity as developers in the process of the invention.

EXAMPLE 7

This example illustrates that substantial levels of cuprous of cupric oxide may be admixed with copper powder before spraying said mixture without inhibiting the formation of a highly conductive layer by the process of the invention.

Thus HIPS preforms of 0.03" (0.76 mm) thickness containing 2% by weight N,N-bis(2-hydroxyethyl)-cocoamine were sprayed with a suspension of the metal/oxide mixtures in dichloromethane and then compression molded 12 min at 215° C. under 5 tpsi (69 MPa) before assessing the surface conductivity by the 4-probe method. Results are shown below.

| Copper:Copper Oxide Spray | Surface Resistance (ohm/sq) | |
|---|---|---|
| | CuO | Cu₂O |
| 90:10 | 0.01 | 0.01 |
| 50:50 | 0.01 | 0.01 |
| 25:75 | 0.06 | 0.01 |
| 10:90 | — | 10M |
| 0:100 | — | — |

These data illustrate that up to 75% of the copper metal may be replaced by oxides of copper without adversely affecting the conductivity of the conductive layer formed.

This evidence suggests that the conversion of non-conductive copper layers to layers exhibiting high conductivity by the process of the invention occurs via an ability to convert copper oxides (which occur naturally, via atmospheric oxidation, upon copper particles) to copper metal.

EXAMPLE 8

The following examples illustrate the applicability of the process of the invention to various metal powders. Because the metal powders were applied from compressed gas spray equipment as a suspension in an organic solvent, the particle size of the metal used had a bearing upon its "sprayability". Metal powders with particle size below 20 μm and especially those between about 1 and 10 μm could be applied most readily. If the mode or equipment used for spraying were altered this particle size requirement might be modified.

A. Copper powders from various sources were sprayed as suspensions in dichloromethane onto HIPS preforms of 0.03" (0.76 mm) thickness to give copper weights of around 3 mg/cm². After drying the metal was sprayed with a solution of N,N-bis(2-hydroxyethyl) tallowamine to afford Cu:developer ratios of 1.3:1 to 3:1 and then the preform was compression molded 10 min at 180° C. under 5 tpsi pressure (69 MPa). After cooling the resistance of the conductive layer was assessed by the four-probe procedure.

| Copper Powder Manufacturer | Manufacturer's Grade Designation | Surface Resistance (ohm/sq) |
|---|---|---|
| Metz Metalurgical Corp (USA) | #90 | 123 |
| | #110 | — |
| | #121 | 12.6 |
| Poudmet (France) | 22BB400 | 0.26–0.012 |
| Alcan (USA) | 400 | 0.005 |
| Alfa (USA) | sub-1-micron | 0.1 |

It can be seen that not all commercially available copper powders are equally active in the process of the invention, but that copper powders from several sources can be employed. The powders from Alcan (400) and Poudmet (22BB400) have been used for the other examples unless otherwise stated.

B. Scanning electron microscopy of the conductive copper layer achieved by the process of the invention using Poudmet 22BB400 (average particle size ca 0.10 μm) copper powder indicated a layer thickness of 5 to 8 μm. Use of a sub-1 micron copper powder (Alfa) resulted in a similar thickness.

C. An experiment similar to (A) was performed using nickel powders from Inco Corp (Grade 255) and Alcan Corp (Grade 756). The alcan 756 could be readily sprayed (especially when suspended in tetrahydrofuran) and resulted in the formation of a grey conductive layer after compression moulding in the presence of N,N-bis(2-hydroxyethyl)cocoamine (less than 5 ohms/square surface resistivity).

D. (Comparative) A 0.03" (0.76 mm) thick HIPS preform was sprayed with a suspension of palladium powder (from Metz Metallurgical Corp., grade #1C of particle size 6 μm) in dichloromethane to give a weight gain of about 0.35 g. After drying 5 min at 20° C. to evaporate the solvent, the palladium was adhered to the plastic (due to solvent swelling) but could be easily rubbed off. The surface resistance of the metal layer was 0.75 was ohms/square. The plaque was then compression moulded 10 min at 180° C. under 5 tpsi (69 MPa) pressure, after cooling the surface resistivity was measured as 0.23 ohms/square. In a further experiment a Pd coated preform was sprayed with a solution of N,N-bis(2-hydroxyethyl)tallowamine to give a Pd: amine weight ratio of about 2.5:1 prior to compression moulding; after cooling a surface resistance of 0.25 ohms/square was measured. This example indicates that palladium has high conductivity when applied to polymer surfaces without requiring a developing agent, and that use of a developing agent of the present invention does not provide any enhancement in the conductivity of the metal layer.

E. Experiments similar to (D) were performed with silver powders and with gold powder. In both cases the metallic coating sprayed onto HIPS was conductive before compression moulding, and after compression moulding in the absence of a developer (such as N,N-bis(2-hydroxyethyl)cocoamine).

F. (Comparative) A 0.07 (1.8 mm) thick HIPS preform containing 2% N,N-bis(2-hydroxyethyl)cocoamine was sprayed with a suspension of aluminum powder in dichloromethane (grades 5100 or 7100 from Alcan). After drying the sample was compression moulded 9 min at 225° C. under 5 tpsi (69 MPa) pressure. After cooling it was found that neither grade of aluminum powder had given a layer with any measurable conductivity (ie greater than $10^7$ ohms/square).

G. (Comparative) Using 0.03" (0.76 mm) thick HIPS preforms a variety of metal powders were sprayed onto the preform and compression molded 15 min at 200° C. under 5 tpsi (69 MPa) pressure; similar experiments were performed in which the metal coating was sprayed with N,N-bis(2-hydroxyethyl)tallowamine prior to molding. In each case the surface resistance after molding was assessed by the four probe method. It was found that metal coatings formed from chromium, manganese, zinc, iron, cobalt, molybdenum, rhenium, tin, or bismuth did not exhibit enhanced conductivity in the presence of the amine developer.

H. HIPS preforms were sprayed with various ratio s of copper powder (Alcan 400) and nickel powder (Alcan 756) suspended in dichloromethane and then the metal coating sprayed with (N,N-bis (2-hydroxethyl)-tallowamine solution. The resulting sample was compression molded for 12.5 min at 200° C. and 5 tpsi (69 MPa) pressure. After cooling the conductivity of the well-adhered metal layer was measured. The metal layer was also examined by x-ray fluoroescence spectrocopy to determine the actual Cu:Ni ratio achieved:

| Ratio in spray suspension | Cu:Ni by X-ray analysis | Surface Resistance (ohm/square) |
|---|---|---|
| 75:25 | 80:20 | 0.23 |
| 50:50 | 44:56 | 0.55 |
| 25:75 | 30:70 | 7-10 |

I. A similar experiment to (H) was conducted using varying ratios of copper and of zinc powders:

| Ratio in spray Suspension | Cu:Zn by X-ray Analysis | Surface Resistance (ohm/sq) |
|---|---|---|
| 85:15 | 97:3 | 0.1 |
| 60:40 | 73:27 | 12.7 |
| 50:50 | 52:48 | 32.3 |
| 27:75 | 20:80 | — |

J. In a fashion similar to (H) and (I), varying ratios of copper powder and aluminum powder were used in the spray suspension. The mold cycle was 12.5 min at 215° C. udner 5 tpsi (69 MPa) pressure.

| Ratio In Spray Suspension | Cu:Al by X-ray Analysis | Surface Resistance (ohm/square) |
|---|---|---|
| 80:20 | 87:13 | 0.21 |
| 60:40 | 60:40 | 100-10k |

The presence of aluminum in the coating resulted in an attractive silver like coloration which might be of use for decorative purposes.

K. Using the procedure of example (9) varying ratios of copper and tin powder were applied to HIPS.

| Ratio In Spray Suspension | Cu:Sn by X-ray Analysis | Surface Resistance (ohm/square) |
|---|---|---|
| 85:15 | 84:16 | 139 |
| 70:30 | 78:22 | 3.4 |
| 60:40 | 76:24 | 20-5k |

L. A sample was prepared as in (J) using a 70:30 wt ratio of copper:tin powders in the spray suspension, but with compression molding being performed at 180° C. for 12.5 min at 5 tpsi (69 MPa) pressure (ie at a temperature substantially below the melting point of tin). The resulting sample exhibited a surface resistivity of 3.6 ohms/square.

The above results indicate that the process of the invention can be applied to the formation of highly conductive layers of copper or of nickel. These metal layers can be as conductive as those made from precious metals such as gold, silver, and palladium. Also the data indicates that substantial amounts of metals (eg:Sn, Zn, and Al) which are not rendered conductive by the developers of the invention may be mixed with copper powder to give coatings of good to high conductivity.

EXAMPLE 9

The following examples illustrate that provided certain conditions are met it is possible to achieve highly conductive coatings using developers of the invention in the absence of pressure.

A. A HIPS preform 4"×3"×0.03" (102×76×0.76 mm) with borders protected by masking tape was sprayed with a suspension of copper powder in dichloromethane/acetone to give a weight gain of 0.3 g after solvent evaporation. The metal was then sprayed with a solution of N,N-bis(2-hydroxyethyl)cocoamine in dichloromethane to give a Cu:amine weight ratio of 2.5:1. The masking tape was removed and a second HIPS preform placed over the metal coated surface and heat welded on all four sides. The sample was placed in an oven at 185° C. for 40 min. After 15 min it was observed that the upper (non-metal coated) piece of HIPS had ballooned (due to the gas pressure of the developer contained within). After the heating period the sample was cooled and the two pieces of HIPS parted. The copper coated surface had become brightly metallic and conductive, but irregular due tot he lack of pressure and the coalescence of the two pieces of HIPS. However, the experiment demonstrates that N,N-bis(2-hydroxyethyl)cocoamine vapor is able to render copper powder on a polymer surface conductive in the absence of pressure.

B. A HIPS preform was sprayed with copper powder in dichloromethane, dried and compression molded 10 min at 200° C. under 5 tpsi (69 MPa) to give a non-conductive, but well adhered copper layer orange in color. A 4"×¾" (102×19 mm) strip of this preform was placed in a glass tube containing 7 drops of N,N-bis (2-hydroxyethyl)cocoamine. The tube was evacuated and purged 2 times with nitrogen before finally evacuating to 1 mm Hg (3.4 kPa). The tube was then placed in an oven for 20 min at 200° C. After removal from the oven and cooling it was found that the copper coating had been rendered highly conductive (less than 1 ohm/square) and pink in color. A similar blank experiment in which no developer was present in the tube resulted in no change in the conductivity of the copper coating. Thus use of heat alone, in the absence of air, is sufficient for developers of the invention to be effective.

C. In experiments conducted as in (B) it was shown that the minimum oven temperature for the amine to cause conversion of the copper layer from low to high conductivity was between 175° and 200° C. (30 minute period in oven).

D. In an experiment similar to (B) the amine was replaced with 7 drops of bis-(beta-hydroxethyl)-dodecanamide, and the sample heated for 30 minutes at 215° C. After cooling the copper coating had been rendered highly conductive and lustrous.

E. In an experiment similar to (B) the amine was replaced with 7 drops of tributylphosphite, and the sample heated for 30 min at 200° C. Upon cooling it was noted that the copper coating had changed color from orange to pink, but was still non-conductive. Thus not all of the developers of the invention are equally effective developing agents in vacuo.

F. A HIPS preform prepared as in example (2) to have a well adhered but non-conductive layer of copper was sprayed with a solution of salicylhydrazone in tetrahydrofuran and then placed in a tube which was subsequently purged with nitrogen, evacuated, sealed, and heated in an oven 30 min at 215° C. Upon cooling the sample was found to possess a pink, lustrous copper surface which showed a conductivity of 71 ohms between two probes placed 1" (25.4 mm) apart.

G. A 0.03" (0.76 mm) thick piece of polyetherimide which bore a circuit pattern formed by transfer molding of copper from an aluminum pattern in the absence of developer at 200° C. and possessing a resistance of 6 ohms over a 3" (76 mm) length of ⅛" (3.2 mm) wide copper track using 2-probes was placed in an evacuated tube containing 6 drops of N,N-bis(2-hydroxyethyl)-cocoamine and the tube placed in an oven for 30 min at 200° C. After cooling the resistance of the same track measured over the same distance had been reduced to 0.1 ohm/square and the color of the copper changed from orange to pink.

This data clearly demonstrates that many developers of the invention can be active in vacuo in the absence of molding pressure and it is therefore possible to envisage their use for enhancing the conductivity of copper powder coatings in a continuous process involving exposure of the coating to developer vapors in the absence of air. For most developers of the invention it is clear that the function of pressure during molding is (a) to exclude air, (b) to contain a reasonable concentration of developer in close contact with the metal particles, and (c) to promote adhesion of the metal to the (fluid) polymer.

EXAMPLE 10

The following examples illustrate the applicability of the present invention to a variety of thermoplastics.

A. 3"×4"×0.03" (102×76×0.76 mm) preforms were prepared from SAN polymer (Tyril 1000—Dow). These were sprayed with a suspension of copper powder in acetone, the solvent evaporated, and then the coated sample compression molded between chromed steel plates for 10 min at 180° C. udner 5 tpsi (69 MPa) became well-adhered but had a surface resistance greater than $10^6$ ohms/square. In a similar experiment the copper coated SAN was sprayed with a solution of N,N-bis(2-hydroxyethyl)tallowamine in dichloromethane prior to compression molding. The resulting metal surface after compression molding was more lustrous and displayed areas of high conductivity (1 ohm/square). mixed with areas of moderate conductivity ($10^3$ ohm/square). A slight increase in molding temperature would probably be beneficial.

B. 3"×5"×0.03" (76×127×0.76 mm) preforms were prepared from polyvinylidenedifluoride (PVDF) (Kynar 460-Pennwalt). A preform was prayed with copper powder suspended in dichloromethane to give a copper loading of about 0.35 g after solvent evaporation. This preform was then compression molded for 13 min at 180° C. under 5 tpsi (69 MPa) pressure. Upon cooling the copper had formed a reasonably well-adhered layer which had a surface resistance of 200 kiloohms/square. Upon repeating the experiment but with a spray of N,N-bis(2-hydroxethyl)tallowamine in dichloromethane applied to the copper coating prior to molding, it was found that the resistance of the copper layer after molding had been reduced to 0.35 ohms/square and the surface appearance had become pink in color. When the molding cycle temperature was raised to 215° C. the adhesion of the upper layer was improved and in the presence of N,N-bis(2-hydroxyethyl)tallowamine and the surface resistance was observed to be 0.02 ohms/square. The developers of the invention can thus be used to form highly conductive copper layers on PVDF - a polymer possessing an unusually high dielectric constant.

C. Preforms similar to those of (A) were prepared from a polymethylmethacrylate resin (Plexiglass—Rohm & Hass). Spray-up of copper powder required the use of tetrahydrofuran as the spray solvent in order to obtain satisfactory build-up of the copper coat. The copper-coated preform was sprayed with a solution of N,N-bis(2-hydroxyethyl)tallowamine in dichloromethane. After solvent evaporation, the preform was compression molded 10 min at 220° C. under 5 tpsi (69 MPa) pressure. Upon cooling the copper surface layer was highly conductive (0.004 ohms/square) and pink, and little copper could be detached by means of adhesive tape. In similar experiment in which the N,N-bis(2-hydroxyethyl)tallowamine was omitted, the copper layer after molding was found to be orange and a great deal more copper could be pulled off of the surface using adhesive tape. In a further series of experiments the molding temperature was varied over the range 180° to 240°. It was observed that at or below 200° C. copper adhesion was poorer due to insufficient plastic flow of the polymer, although use of N,N-bis(2-hydroxyethyl)tallowamine gave some enhancement of the conductivity (reduced from $10^6$ to $10^3$ ohms/square). Even at 240° C. it was observed that samples molded in the presence of N,N-bis(2-hydroxyethyl)tallowamine resulted in a copper layer exhibiting better adhesion of the copper than samples molded in the absence of this developer, and also that the surface resistance of the amine treated samples was lower.

D. Preforms similar to those above were molded from polyphenylene sulfide (Ryton R10-7006A - Phillips) pellets at 310° C. This polymer is a high temperature, intrinsically flame retardant material. It was necessary to place both the PPS pellets and the preforms therefrom (used below) between 0.005" (0.13 mm) thick sheets of PTFE polymer during compression molding to prevent adherence to the mold surfaces. A preform was sprayed with a suspension of copper powder in dichloromethane to give a copper weight of 0.3 g and then molded 12 min at 280° C. under 5 tpsi (69 Mpa); after cooling it was observed that resin flow had occurred and a well-adhered copper layer had formed with a surface resistance of $10^3$ to $10^6$ ohms/square. Repetition of this experiment with the copper coated sampled sprayed with a solution of N,N bis(2-hydroxyethyl)tallowamine to give a Cu: developer ratio of 2:1 to 3:1 prior to molding resulted in slightly higher polymer flow, a well-adhered, more lustrous copper layer, with a surface resistance of 0.002 ohms/square. At 270° C. and 260° C. much less flow of the PPS occurred and the metal coating was compacted together; under such compaction conductivity in the absence of developer can be a few ohms/square but adhesion in inadequate, and use of the developer at such temperature still lowers the surface resistance (to 0.02 ohms/square). This data illustrates again the importance of conducting the process of the invention at a temperature sufficiently high to cause significant polymer flow; this is essential to achieving a well-adhered copper layer rather than a compacted metal powder.

E. 4"×3"×0.03" (102×76×0.76 mm) preforms were prepared from a modified polyphenylene oxide polymer (Noryl N225, General Electric). Copper powder suspended in dichloromethane was sprayed onto the preform to give a 0.2 g loading after solvent evaporation and the preform compression molded for 10 min at 175-180° under 5 tpsi (69 MPa). This resulted in a well-adhered layer of copper due to polymer flow. Surface conductivity was above $10^6$ ohms/square.

One half of the sample was then sprayed with a solution of N,N-bis(2-hydroxyethyl)tallowamine in dichloromethane so as to afford a 2.5:1 raton of Cu:developer and then remolded for 10 min at 180° C. Upon cooling the resistance of the copper coating was found to be less than 1 ohm/square.

F. A 4"×4"×0.03" (102×102×0.76 mm) preform of a modified polyphenylene oxide (Noryl NFN-2) containing glass-fiber reinforcement was sprayed with copper powder suspended in dichloromethane to give a 0.3 g loading of metal, and then sprayed with a solution of N,N-bis(2-hydroxyethyl)tallowamine to give a 2:1 Cu:amine weight ratio. The preform was compression molded at 180° C. for 10 min under 5 tpsi (69 MPa) pressure. Upon cooling a lustrous, well-adhered layer or copper was observed with a surface resistance of less than 1 ohm/square. Thus the presence of glass-fiber reinforcement does not prevent the action of developers of the invention.

G. Using the polymer described in (E) the metallization process was examined using copper powder and N,N-bis(2-hydroxyethyl)tallowamine developer in closed cavity molds. The mold cycle used was 10 min at 180° under 5 tpsi (69 MPa), time being taken from the point at which the mold reached 180° C. In one experiment the amine was applied to a copper coated preform as a solution in 65:35 dichloromethane:acetone. With 0.3-0.43 g loadings of copper on a 5"×5"×0.08" (127×127×2.0 mm) preform and Cu:developer ratios of 1.3:1 to 4.6:1 the coating obtained had a surface resistance of less than 0.01 ohms/square. In other experiments preforms were utilized into which 2% by weight of N,N-bis(2-hydroxyethyl)cocoamine had been compounded. With a similar molding cycle highly conductive copper layers (less than 0.01 ohms/square) were again observed. It was noted that the use of closed cavity molds together with in-polymer developer gave good surface appearances. The lustre obtained on Noryl type polymers by the process of the invention is very good, suggesting that such coatings might be of use in decorative applications.

H. Attempts were made to incorporate N,N-bis (2-hydroxyethyl) tallowamine into a polycarbonate polymer (Lexan 141, General Electric) by means of a single-screw extruder. The resulting formulation was found to be extremely brittle under compression molding conditions. Similarly attempts to use N,N-bis(2-hydroxethyl)-tallowamine and N,N-bis(2-hydroxyethyl) cocoamine as spray-on developers for copper coatings on polycarbonate resulted in extensive pitting and de gradation of the polymer, even at 175° C. Using closed cavity molds polycarbonate preforms were sprayed with copper powder (Alcan 400) suspended in dichlormethane:acetone (65:35) to give around 0.4-0.5 g loading of copper (on 5×5" (127×127 mm) preforms) and then sprayed with a solution of tributylphosphite so as to afford ratios of Cu:(BuO)$_3$P varying from 3.6:1 to 35:1 and the samples then compression molded 10 min at 175-180° C. under 5 tpsi (69 MPa) pressure. In the absence of the developer the copper layer displayed a resistance of $10^3$-$10^4$ ohms/square. In the presence of (BuO)$_3$P in ratios above 5:1 the copper layer exhibited resistance of below 1 ohms/square, and a good surface appearance, free of pitting, could be achieved. Thus the substitution of tributylphosphite in place of an amine as developer allows polycarbonate to be effectively metallized by the process of the invention.

I. Using a single screw extruder N,N-bis(2-hydroxyethyl) tallowamine was compounded into a nylon 6 polymer (Zytel 211, DuPont) at 2% by weight. Preforms were prepared from this, sprayed with copper powder, and molded at 215-220° C. for 12 min at 5 tpsi (69 MPa) pressure. This resulted in the formulation of a highly conductive (0.1 ohm/square or less), shiny copper coating. However, adhesion of the coating was poor and the copper could be peeled away from the surface of the nylon. Pretreatment of the nylon surface with LICA38 (a neoalkoxytitanate coupling agent sold by Kenrich) prior to applying the copper powder, followed by a similar mold cycle resulted in better adhesion but gave a non-conductive coating. Nylon 6 is difficult to compression mold because of its rather sudden change in melt viscosity with temperature and the lack of adhesion of the copper coating at 215° C. can be attributed to insufficient polymer flow at that temperature. Use of different molding technique which would allow more flow to occur would be expected to yield highly conductive copper coatings on nylon 6 with better metal-polymer adhesion.

J. Attempted incorporation of N,N-bis-(2-hydroxyethyl) cocoamine at 2% by weight into polybutylene terephthalate (Valox 325, General Electric) and polyethylene terephthalate (Rynite 530, DuPont) by extrusion resulted in some degradation and also brittle preforms. Nevertheless it was possible to spray copper powder onto these preforms and achieve a highly conductive layer after compression molding at temperature in the range of 230-240° C.

Further experiments with PBT polymer concentrated upon the use of developers sprayed onto the copper powder coating prior to compression molding Using a 0.3 g loading of copper powder and a 3:1 ratio of Cu:N,N- bis(2-hydroxyethyl)tallowamine on a 4"×4"×0.03" (102×102×0.76 mm) PBT preform the copper layer was found to exhibit a resistance of 10 ohms/square when molded 10 min at 220° C. under 5 tpsi (69 MPa) pressure without the application of the amine, but this changed to less than 1 ohm/square after applying the amine and remolding for a further 10 min. at 220° C. However, at 220° C. the surface layer of copper was poorly adhered to the PBT due to the lack of polymer flow during molding. When the molding temperature was increased to 240-250° C. the polymer resin flowed under molding pressure and good adhesion of the copper to the PBT surface could be achieved. In the absence of N,N-bis(2-hydroxyethyl)tallowamine treatment and with copper loading of around 3 mg/cm$^2$ of surface area, the well adhered copper coatings produced by molding at 240-250° C. were found to be of low conductivity (greater than $10^4$ ohms/square). If treatment with N,N- bis(2-hydroxethyl)tallowamine and remolded 10 min at 250° C. the copper layer was found to become conductive and well-adhered (below 1 ohm/square). In further experiments on PBT polymer it was found that excessive loadings of copper (greater than 4-5 mg/cm$^2$) powder could result in conductive layers of copper being formed in the absence of developing agent due to simple compaction of the particles. (Adhesive tape would lift off some of the copper from such coatings).

In one experiment 0.31 g weight of copper was sprayed onto a 3"×4"×0.03" (102×102×0.76 mm) PBT preform and this molded 3 min at 270° C. udner 1 tpsi (14 MPa) pressure to afford an orange colored, well adhered layer. A piece cut from this sample having a resistance above $10^6$ ohms/square, was sprayed with a solution of N,N-bis(2-hydroxethyl)tallowamine in dichloromethane to give a Cu:amine ratio of 3:1 and then remolded 12 min at 200° C. under 5 tpsi (69 MPa) pressure. The surface resistance was decreased to less than 1 ohm/square and the surface became pink. This result indicates that the temperature required to obtain adequate metal to polymer adhesion and the temperature required to develop high conductivity by the invention are not necessarily the same.

In the above experiment it was observed that use of N,N-bis(2-hydroxyethyl)tallowamine as the developer caused some softening of the PBT substrate. In a further experiment a PBT preform was sprayed with a copper powder suspended in tetrahydrofuran to give a 0.25 g loading after solvent evaporation. The copper coating was then sprayed with a solution of tributylphosphite to give a weight gain of 0.075 g after solvent evaporation. The preform was then compression molded 12 min at 240° C. under 5 tpsi (69 MPa) pressure. Upon cooling the PBT bore a well-adhered, pink, layer of copper with a surface resistance of 0.2 ohms/square. Use of tributylphosphite as developer did not cause any softening of the PBT.

K. Preforms were prepared from polyethyersulfone (Victrex 4100P, ICI) by molding at 240° C. Attempts to incorporate N,N bis(2-hydroxyethyl)tallow amine into the PES by extrusion resulted in non-homogenous, somewhat brittle, samples.

A series of PES preforms 4"×4"×0.03" were sprayed with a suspension of copper powder in dichloromethane to give a weight gain of about 0.25 g of copper after solvent evaporation. The preforms were compression molded at various temperatures between 150° C. and 250° C. for 10 min at 5 tpsi (69 MPa) pressure. After cooling, the copper layers were examined for conductivity by the four-probe method, and for adhesion by means of tape attached to the metal surface. Following this the samples were cut in half and one half sprayed with a solution of N,N-bis(2-hydroxyethyl)tallowamine in dichloromethane to give Cu:amine ratios of around 2:1 to 4:1 and then molded a further 10 min. After cooling the conductivity and adhesion were reassessed. Below 220° C. adhesion of the copper layer was generally poor due to non-flow of the PES, and the copper could easily be scratched away. At 200-220° C. there was some evidence which indicated that treatment with the amine improved the adhesion of the copper. Above 220° C. adhesion of the copper coating was much improved, particularly in the presence of developer, due to good flow of the PES. Use of the amine in samples molded at below 220° C. led to copper layers exhibiting enhanced conductivity (below 0.1 ohms/square) but of insufficient adhesion. Of particular interest however, was the observation that at temperatures above 200° C., copper powder sprayed onto PES polymer produced copper layers of high conductivity, in the absence of a developing agent.

Thus one of the above samples molded without the amine for 10 min at 250° C. possessed a well-adhered copper layer with a surface resistance of 0.03 ohms/square, use of the amine at the same temperature led to some pitting. A series of experiments were performed using acetone as the spray solvent in place of dichloromethane. Again at 220° C. a highly conductive copper layer was achieved in the absence of developer.

L. PES pellets were subjected to solvent extraction in a Soxhlet apparatus for seven days using a mixture of xylene and chloroform (90:10), and then pressed into preforms. These were sprayed with copper powder, and in some cases also with N,N-bis(2-hydroxyethyl)tallowamine and compression molded at 220° C. No difference in conductivity of the copper layer with or without the amine was observed (0.01 ohm/square) but use of developer enhanced the adhesion of the copper to the PES. These results indicate that the reason for the ability of PES to afford highly conductive layers of copper, when sprayed with copper powder and compression molded, is probably not due to the presence of polymerization catalyst residues or of phosphorus containing antioxidants.

M. Preforms were prepared from polyetherimide (Ultem 1000, General Electric) by molding at 290° C. It was not possible to incorporate developers such as N,N-bis(2-hydroxyethyl)tallowamine into PEI without causing brittleness. PEI preforms were sprayed with a suspension of copper powder and compression molded 10 min under 5 tpsi (69 MPa) pressure at various temperatures. After assessing conductivity of the layer one half of the sample was sprayed with a solution of N,N-bis(2-hydroxyethyl)tallowamine and remolded 10 min and the copper layer then reassessed for conductivity. At temperatures below 200° C. the use of the amine caused a reduction of the resistance from $10^6$ ohms/square to less than 1 ohm/square but metal adhesion was poor both with and without the amine. With PEI significant resin flow does not occur under pressure below 230–240° C. Thus in order to achieve well-adhered copper coatings on PEI compression molding must be performed at 230° C. or above. In the absence of developer the copper layers formed on PEI tend to be orange in color and lack luster. Use of the amine improves both the color and lustre of the copper layer and can improve conductivity (see Example 4.E).

N. PEI pellets were solvent extracted as in (L), molded into preforms, and preassessed (with copper powder) in the absence and presence of N,N-bis(2-hydroxyethyl)tallowamine. It was observed that solvent extraction did not prevent PEI from affording conductive copper layers in the absence of a developer when sprayed with copper powder and molded at 220° C. It may be noted that use of the amine at 220° C. and above improved the adhesion of the copper layer.

O. PEI preforms were sprayed with a suspension of nickel powder (Alcan 756) in tetrahydrofuran and dried. After being compression molded for 10 min at 230° C. under 5 tpsi (69 Mpa) pressure, and cooled the preform was found to bear a grey layer of nickel which exhibited high conductivity in many areas. The same experiment was repeated except that N,N-bis(2-hydroxyethyl) tallowamine was sprayed onto the nickel powder coated preform prior to molding. After cooling the preform was found to possess a shiny, well-adhered, nickel layer of high conductivity. When similar experiments were carried out at 180° C. adhesion of the nickel to PEI was inadequate. These results indicate that the attainment of highly conductive nickel coatings upon PEI do not necessarily require the use of a developer.

P. Low density polyethylene (DFD4140, Union Carbide)preforms 0.03" (102×76×0.76 mm) thick were prepared. A preform was sprayed with copper powder suspended in dichloromethane to give a 0.2 weight of copper after solvent evaporation. This was pressed for 10 min at 180°–185° C. under 5 tpsi (69 MPa) pressure. Upon cooling the metal layer possessed a surface resistance of $10^6$ ohms/square or higher. When a similar sample was sprayed with N,N-bis(2-hydroxyethyl)tallowamine solution prior to molding it was found that the metal layer had a surface resistance varying from 19 to 350 ohms/square. In these experiments, however, it was noted that adhesion of the copper layer to LDPE was poor despite reasonable polymer flow having occurred; this is attributed to the extremely non-polar character of the LDPE surface. Conventional surface pretreatments of the LDPE surface such as flame treatment or chromic acid treatment would be expected to produce better adhesion.

In another experiment copper powder was sprayed onto LDPE into which 1 or 2% by weight of N,N-bis(2-hydroxyethyl)tallowamine had been compounded. It was found difficult to obtain adhesion of the copper layer to the surface after compression molding. This problem could be overcome by treatment of the LDPE preform with Eccoprime PP (Emerson and Cumings) a commercial etchant for polymers. After treatment with this etchant by soaking one hour at 23° C. and then wiping dry, and LDPE preform containing 1% by weight of N,N-bis(2-hydroxyethyl)tallowamine was sprayed to give a copper coated sample. After compression molding for 10 min at 180° C. and 5 tpsi (69 MPa) pressure the metal layer was found to possess a surface resistance of 20 to 131 ohms/square and was better adhered.

Q. Ethylene propylene diene monomer (EPDM) polymer was compounded on a two-roll mill at 150° C. with 1% by weight of Perkadox 14/14 and then compression molded for 6 min at 180° C. to afford a cross-linked elastomeric polymer. Plaques were cut from the sheet and sprayed with a suspension of copper powder in dichloromethane, ethanol, acetone, or toluene. The copper coating was then sprayed with a solution of N,N-bis(2-hydroxyethyl)tallowamine and then compression molded at 180° C. for 8 min. After cooling it was found that the copper coating could be easily wiped from the surface of the EPDM. The failure to obtain adhesion is attributed to the inability of this polymer to flow (due to its cross-linked nature).

EXAMPLE 11

The following examples illustrate that by suitable modifications the developers of the present invention may be used to enhance the conductivity of copper layers on thermoset polymer compounds.

A. A thin layer of a commercial epoxy resin (CONAP EASYPOXY K-20) was spread upon a supporting sheet (¾×3") of polyetherimide and the sample placed in an oven at 55° C. for 6–7 min. At the end of this period the sample was removed from the oven and sprayed with a suspension of copper powder in dichloromethane until good coverage of the epoxy resin was observed. The metal coated sample was then replaced in an oven at 55° C. for 30 min, followed by a period of 30 min at 200° C. in a second oven. Upon removal of the sample the epoxy resin was fully cured, the copper had turned gold in coloration and was well adhered, but exhibited little conductivity (greater than $10^7$ ohms/-square). The sample was placed in a glass tube containing 5 drops of N,N-bis(betahydroxyethyl)dodecanamide and the tube evacuated, purged twice with nitrogen, and evacuated to 1 mmHg. The tube was then placed in an oven at 215° C. for 45 min. Upon removal of the sample from the tube, after cooling, the copper layer had been rendered pink/orange in color and highly conductive (below 10 ohms over a 1" (25.4 mm) distance with a 2-probe ohmmeter).

B. An experiment similar to (A) as preformed except that 7 drops of N,N-bis(2-hydroxyethyl)cocoamine were used in the evacuated tube in place of the amide, and a developer time of 1 h at 200° C. was employed.

Again the copper surface was rendered pink and highly conductive. Use of N,N-bis-(2-hydroxyethyl)cocoamine in place of the amide appeared to cause the surface of the epoxy resin to soften somewhat.

C. The experiment in (A) was repeated with the time for which the epoxy resin was placed in the oven at 55° C. prior to copper spray-up varied over the range 3 min to 20 min. It was observed that if copper spray up was performed after 3-7 min a highly conductive copper layer was not consistently obtained. Conversely is spray up of the copper was performed after curing the epoxy for 20 min at 55° C. adequate adhesion of the copper layer could not be achieved. The optimum cure time at 55° C. (for the particular epoxy resin used here) was found to be 10 min. This ensured an adequately adhered copper layer whilst allowing high conductivity to be achieved.

D. Samples were prepared as in (C) except that the postcuring cycle for the copper coated epoxy resin was varied over the range 140° C. to 230° C. with a time of 30 min. For all temperatures a pink, highly conductive copper layer was achieved.

E. A sample was treated as in (C) except that the copper suspension in dichloromethane used for spray up also contained 2% wt/vol N,N-bis(2-hydroxyethyl)-cocoamine. A conductive copper layer was achieved with somewhat less distortion (buckling) of the support layer than in (C). The small amount of amine applied during copper spray-up was demonstrated in a separate experiment to be insufficient to cause any color change or conductivity enhancement of the copper layer when the sample was heated in an evacuated tube containing no additional developer.

F. 50 g of a commercial unsaturated polyester resin (OCF-E701) to which had been added 0.1% (weight) of cobalt naphthenate and 0.025% of dimethylaniline was mixed with 0.5 g of a commercial peroxide (Cadox M50) and poured into a mold measuring about 4"×4" (102×102 mm) and allowed to cure at 23° C. for 15 min. After this time the resin had gelled but retained some tackiness on the surface. A layer of copper powder was sprayed onto the surface of the polymer as a suspension in dichloromethane. The coated polymer was then allowed to cure for 1 h at 23° C. to afford a well adhered, orange, and non-conductive surface layer. A sample strip cut from this polymer specimen was exposed to N,N-bis-(2-hydroxyethyl) cocoamine vapor in an evacuated glass tube for 30 min at 200° C. The copper layer was not rendered conductive. The remainder of the coated specimen was post-cured by placing in an oven at 200° C. for 30 min. Upon removal the copper layer remained non-conductive and had changed to gold in color. When the sample was exposed to N,N-bis (2-hydroxyethyl)cocoamine vapors in an evacuated tube for 30 min at 200° C. the copper layer turned pink and became conductive (about 1 ohm/square).

From the above data it can be seen that developers of the invention may be used to enhance the conductivity of copper powder layers applied to thermoset polymers. The adhesion of the metal powder to thermosets is achieved by applying the powder whilst the resin is in a semi-cured state and retains a tacky surface or a surface still susceptible to swelling by the spray solvent (in the metallization of thermoplastics by the process of the invention, pressure is applied at above the temperature at which a particular polymer exhibits flow in order to achieve adhesion). It is clear that for a given thermoset formulation there will be an optimum point at which to apply the metal powder and also an optimum post-cure cycle/development cycle.

EXAMPLE 12

In these examples it is shown that the process of the invention may be practiced upon polymers containing commercial halogenated flame retardants.

A. 0.03" (0.76 mm) thick preforms were made from modified polyphenylene oxide polymer compounded to contain 2% or 4% N,N-bis(2-hydroxyethyl)cocoamine, 10.3% decabromodiphenyl oxide, and 3.4% antimony oxide. Copper powder was sprayed onto the preform as a suspension in dichloromethane and after drying to ensure solvent evaporation, the preforms were compression molded at 215° C. for 12 min under 5 tpsi (69 MPa) pressure. After cooling, the surface resistance was measured by the four-probe method. With 2% of the amine present and a 3:1 Cu:developer ratio the surface resistance was 44 ohms/square; at a 4% loading of the amine this was reduced to 1 ohm/square or less.

B. In a similar manner polypropylene preforms were prepared containing 3% of Saytech's BN451 brominated flame retardant ethylene bis(dibromonorbornanedicarboximide), 1% antimony trioxide, and either 2% or 4% of N,N-bis-(2-hydroxyethyl)cocoamine. After spraying with copper powder in tetrahydrofuran to give Cu:developer weight ratios of 1.6:1 to 3.1:1, the samples were compression molded. Samples containing 2% of the amine were found to exhibit surface resistance values ranging from 30 ohms/square and upwards when molded at 225° C. Samples containing 4% of the amine possessed surface resistance values generally of 1 ohm/square or lower after molding at 215-225° C.

C. In a fashion similar to (A), 0.03" (0.76 mm) thick HIPS preforms were prepared containing 10.3% decabromodiphenyloxide and/or 3.4% antimony oxide together with 0.5% calcium stearate and either 2% or 4% N,N-bis-(2-hydroxyethyl)cocoamine. After spraying with copper powder in dichloromethane the preforms were compression molded 12.5 min at 215° C. under 5 tpsi (69 MPa) pressure. The following data were measured.

| Wt % DBBPO | Wt % $Sb_2O_3$ | Wt % Amine | Surface Resistance (Ohm/sq) |
|---|---|---|---|
| — | 3.4 | 2 | 0.1 and below |
| — | 3.4 | 4 | 0.1 and below |
| 10.3 | 3.4 | 2 | 146–10$^6$ |
| 10.3 | 3.4 | 4 | 10–30 |

D. ABS preforms were prepared containing 10.3% decabromodiphenyloxide, 3.4% antimony oxide, and 2% 4%, 6%, or 10% N,N-bis(2-hydroxyethyl)cocoamine. After spraying with copper powder in dichloromethane the preforms were compression molded for 12.4 min at 235° C. under 5 tpsi (69 MPa) pressure. With a copper weight of around 0.35 g the following data were obtained:The data demonstrate that the metallization process can be effected in the presence of commercial flame retardants to give conductive copper layers, but that increases in developer

| % Amine | Surface Resistance (ohm/sq) |
|---|---|
| 2 | — |
| 4 | 1.5 |

-continued

| % Amine | Surface Resistance (ohm/sq) |
|---|---|
| 6 | 0.6 | loadings and/or somewhat higher molding temperatures can be a advantageous.

EXAMPLE 13

This example demonstrates that conductive metal surface layers produced using the invention can act as shields towards electromagnetic interference (EMI).

A. High-impact polystyrene was compounded on a two-roll mill with N,N-bis(2-hydroxyethyl)cocoamine (50% concentrate in polystyrene) so as to give a formulation containing 2% by weight of the amine, and pressed into sheets of 0.012" (0.30 mm) thickness. These sheets were sprayed with a 10% suspension of copper powder in dichloromethane so as to give a Cu:amine ratio of between 2:1 and 4:1 by weight. The sample was then compression molded for 12.5 min at 215° C. After cooling the plastic surface had a bright, well-adhered, layer of copper with a surface conductivity of less than 0.01 ohms/square. From these sheets samples of 3"×6" (76×152 mm)size were cut. The samples were glued to either one, or to both, face(s) of a similar sized piece of HIPS to afford a 3"×6"×⅛" (76×152×3.2 mm)testpiece. The test-pieces were then measured, according to ASTM ES7-83, by the dual-chamber (near field) method in order to assess the degree of EMI shielding afforded by the conductive layer.

A solid ⅛" (3.2 mm) thick copper bar was used as a standard. Results are shown below.

| Sample | EMI Attenuation (dB) | | | |
|---|---|---|---|---|
| | 30 MHz | 100 MHz | 300 MHz | 1000 MHz |
| 1 face Cu | 81 | 42 | 69 | 53 |
| 2 faces Cu | 85 | 94 | 97 | 98 |
| Control | 85 | 98 | 110 | 97 |

Note:
40 db = 99.99% of radiation does not pass
80 dB = 99.999999% of radiation does not pass It can be seen that copper coatings provided by the process of the invention act as very effective shields towards EMI.

B. Samples of HIPS bearing nickel layers on one or both face(s) were produced from nickel powder in manner similar to (A). The surfaces had resistances of 0.1 to 1.5 ohms/square.

EMI measurement s were as follows:

| Sample | EMI Attenuation (dB) | | | |
|---|---|---|---|---|
| | 30 MHz | 100 MHz | 300 MHz | 1000 MHz |
| 1 face Ni | 47 | 31 | 22 | 14 |
| 2 faces Ni | 36 | 25 | 17 | 13 |

It can be seen that the nickel coatings produced by the process of the invention also provide a degree of shielding against EMI. The degree of shielding offered by the nickel coating is less than that offered by a copper coating.

EXAMPLE 14

In this example the process of the invention is used to fabricate a functioning pressure switch.

A polypropylene sheet of 1 mm thickness containing 1% N,N-bis(2-hydroxyethyl)tallowamine was sprayed with a suspension of copper powder in dichloromethane, dried and compression molded to give a well adhered, continuous, copper coating with a surface resistance less than 1 ohm/square. From this metallized sheet were cut two 5"×5" (127×127 mm) square samples. Each sample was then treated to remove two 1/16" (1.6 mm) wide strips of copper coating so as to divide each sample into three approximately 1½"×5" (38×127 mm) regions bearing conductive copper. A 5"×5"×0.5" (127×127×1.3 mm) piece of Mylar film into which nine ¾"×182 " (19×19 mm) square "holes" had been cut was then placed over one of the copper coated PP samples such that three holes lay over each of the three conductive regions. The second copper coated sample was then placed over the Mylar so that its coated face was in contact with the Mylar, and such that the two strips from which copper had been removed were aligned at right angles to the similar copper-free strips on the first copper coated sample. The Mylar serves as an insulator to prevent contact between the two copper coated samples. However, the PP being somewhat flexible/elastic, finger pressure on the top of one PP sample over one of the Mylar "holes" is sufficient to bring one conductive surface into good electrical contact with the other conductive surface (ie a pressure sensitive switch is formed). By the above arrangement a 3×3 contact matrix is made by connection of appropriate regions to lights, buzzers, or motors and to a power supply such devices may be controlled by finger contact upon the polypropylene.

EXAMPLE 15

To a 1000 ml flask equipped with an efficient stirrer and a reflux condenser was added 500 g of N,N-bis-(2-hydroxy-ethyl)tallowamine and 100 g of copper powder (Poudmet). Stirring was maintained at 210–230° C. for 60 minutes. During this period the initially orange colored copper particles became bright pink. The contents of the flask were poured, while hot, into a sealed container and allowed to cool. When cool the solidified amine/metal powder mixture was extracted and washed with isopropanol to remove the amine. The copper powder was recovered by filtration; washing with isopropanol was continued until the wash liquid tested negative for the presence of amine, dried in air under vacuum for 15 minutes and then in an oven at 50° C. for 20 minutes. The dry copper powder was stored in sealed containers until required.

When this copper powder (b 10 g) was placed into a non-conductive tube of ⅝" (15.9 mm) diameter and compressed by two metal rods to a length of 1 cm and the conductivity between the ends of the two rods assessed by means of an Ohm meter, a resistance of 1.2 Ohms was measured. Similar measurement of copper powder which had not been pretreated as described in this example gave a resistance of $10^6$ Ohms or greater. Thus the treatment of copper powder as described with developers of the present invention affords metal powder of improved conductivity.

EXAMPLE 16

Using the copper powder prepared in Example 15, a suspension was made in dichloromethane. This suspension was sprayed onto a 3"×4"×0.03" thick (76×102×0.76 mm) preformed plaque of high-impact polystyrene. After drying in an oven at 55° C. the plaque possessed a loosely adhered copper coating of 0.25 g. The plaque was then subjected to compression molding at 200° C. for 10 minutes under 5 tons/square inch (69 MPa) pressure. This gave a well adhered surface layer of copper which was bright pink in color and highly conductive (below 2 ohms/square).

This result demonstrates that developers of the present invention can be used to pretreat copper powder prior to its application to polymer substrates. Such pretreated metal may then be used to produce highly conductive surface layers or polymers without recourse to additional applications of developer during the molding cycle. It is presumed that during pretreatment the amine chemically reduces the oxide layer on the surface of the metal particles.

EXAMPLE 17

20 g of a commercial epoxy resin (EASYPOXY K-230, ex Conap, 70:30 resin:hardener) was prepared and screen-printed onto a 4"×3" (102×76 mm) polyetherimide support to from an area of epoxy 3"×2" (76×51 mm). The sample was placed in an oven at 100° C. for 15 minutes, and then a second layer of the epoxy resin was screen printed on top of the first layer of epoxy. The sample was again heated for 15 minutes at 100° C. A third layer of epoxy resin was then screen printed on top of the second epoxy layer. The sample was then B-staged by heating at 55° C. for 20 minutes. This gave a tacky, semi-cured, upper epoxy layer. A suspension of the pretreated copper powder, prepared in Example 15, in dichloromethane was then sprayed onto the semi-cured epoxy. The sample was allowed to stand at ambient temperature for 5 minutes and then heated for 15 minutes at 100° C. in order to completely cure the epoxy layer. After removal of loose copper a sample was obtained which bore a well adhered layer of copper and which possessed a surface resistivity of 10 ohm/square. This example illustrates that copper powder pretreated at elevated temperature with developers of the present invention may be used to obtain conductive surface layers on thermoset resins without exposure of the polymer to developer at elevated temperatures.

EXAMPLE 18

The procedure described in Example 17 was followed except that screen-printing of the epoxy was done using a screen which resulted in the printing of a circuit pattern (of epoxy) onto the substrate, and that the pretreated copper was suspended in methanol rather than dichloromethane. After application of the copper and fully curing the epoxy layer, it was possible to wash non-adhered copper from the substrate with water. A well adhered, conductive circuit trace was obtained by this procedure.

EXAMPLE 19

Part A: A 25% solution of ABS resin in acetone was prepared and poured into a 2" (51 mm) diameter aluminum tray. The acetone was allowed to evaporate at room temperature until the sample surface was tacky. A suspension of copper powder (Poudmet) in dichloromethane was then sprayed onto the tacky resin surface. The sample was allowed to stand at room temperature for 60 minutes and then heated at 85° C. for 60 minutes. The sample was removed from the pan and was found to bear a reasonably well-adhered but non-conductive layer of copper. A specimen cut from the sample was placed in a glass-tube containing a few drops of N,N-bis-(2-hydroxyethyl) lauramide, the tube evacuated of air and then sealed and heated in an oven at 180° C. for 50 minutes. AFter cooling, the copper layer had been converted to high conductivity (1 ohm/square).

Part B: A solution of polyetherimide in dichloromethane was prepared. This was poured into an aluminum dish and the solvent allowed to evaporate at 20° C. for 10 minutes. A suspension of pretreated copper powder (prepared as described in Example 15) in dichloromethane was the sprayed onto the tacky resin surface. The sample was allowed to stand overnight at 20° C. After wiping off excess copper powder an adhered layer of copper was obtained which was highly conductive without the need for additional exposure to developers of the present invention.

This example demonstrates that conductive copper layers may be obtained on thermoplastics by application of copper powder (pretreated or not) to "solvent-cast" films while such films possess sufficient tack to adhere the metal particles. The films may be "cast" by other methods known to those skilled in the art.

EXAMPLE 20

Part A: A 3"×4"×1/16" (76×102×1.6 mm) injection molded polyetherimide preform was immersed to a depth of 2" (31 mm) into dichloromethane for 10 minutes. This caused a swelling and softening of the polymer surface. A suspension of copper powder (pretreated as in Example 15) in dichloromethane was then sprayed onto the polymer surface. The sample was allowed to dry for 3 hours at 20° C., and excess copper removed. The sample bore a well adhered pink layer of copper with a surface resistivity of 0.35 ohm/square.

Part B: A sample prepared as described in Part A was dipped into a dichloromethane solution of polyetherimide several times; after each dip the solvent was allowed to evaporate. After six cycles the conductive copper layer had been coated with a layer of polyetherimide. THis layer of dip-coated polymer was then dipped into dichloromethane until tacky and sprayed with pretreated copper to obtain, after solvent evaporation, a second layer of conductive copper.

We claim:

1. A method of forming a conductive metal layer on a substrate, comprising:
   a. a depositing step of depositing a layer of copper or nickel metal particles on a temporarily deformable substrate;
   b. a contacting step of contacting, in the absence of a binder, the metal particles with a developing agent comprising (i) a long-chain aliphatic tertiary amine containing at least one coco, tallow, or hydrogenated tallow group; (ii) a tertiary phosphine or a tertiary phosphite; or (iii) a bifunctional compound being selected from the group consisting of diamines, alkanolamines, secondary amino alcohols, tertiary amino alcohols, secondary sulfides, hydrazides, hydrazones, oximes and tertiary amides and having both (1) a first atom which is a trivalent nitrogen atom or a bivalent sulfur atom and (2) at least one second atom which is nitrogen or oxygen; the first and second atoms being separated by at least two other atoms; the bifunctional compound being capable of forming a coordination complex with copper or nickel; and
   c. a heating step of subjecting the metal particles and the developing agent to heat, in the substantial absence of oxygen, at a temperature and for duration sufficient to improve the conductivity of the metal layer.

2. The method of claim 1 wherein said depositing step comprises spraying the metal particles onto the substrate.

3. The method of claim 2 wherein the spraying is done with the aid of a liquid suspension agent.

4. The method of claim 3 wherein the liquid suspension agent is an inert organic solvent.

5. The method of claim 3 wherein at least a portion of the liquid suspension agent is the developing agent.

6. The method of claim 1 wherein the copper or nickel contains less than about 40 weight of non-conductive layer forming metals.

7. The method of claim 1 wherein the copper or nickel contains less than about 20 weight % of non-conductive layer forming metals.

8. The method of claim 1 wherein the metal particles have a number average particle size of less than about 30 μm.

9. The method of claim 1 wherein the metals are present in the form of an alloy containing less than about 25 weight % of other non-conductive layer forming metals.

10. The method of claim 1 wherein the metal particles are in the form of flakes.

11. The method of claim 1 wherein said heating step takes place at 150–400° C.

12. The method of claim 11 wherein said heating step takes place at 180–220° C.

13. The method of claim 1 wherein said heating step takes place at temperature below the melting point of any substantially present metal.

14. The method of claim 1 wherein said heating step is accompanied by the application of pressure to the deposited metal particles.

15. The method of claim 14 wherein the pressure is 5–100 MPa.

16. The method of claim 1 wherein said heating step takes place at or above the softening point of the substrate.

17. The method of claim 1 wherein the substrate is a synthetic resin.

18. The method of claim 17 wherein the substrate is a thermoplastic resin.

19. The method of claim 17 wherein the substrate is an incompletely cured thermoset resin.

20. The method of claim 17 wherein the synthetic resin includes a flame retardant composition containing antimony, chlorine, or bromine.

21. The method of claim 1 wherein said contacting step comprises spraying the developing agent in liquid form onto the deposited metal particles.

22. The method of claim 1 wherein said contacting step comprises incorporating the developing agent into the substrate.

23. The method of claim 1 wherein said contacting step comprises exposing the metal particles to a vapor of the developing agent.

24. The method of claim 1 wherein said depositing step comprises applying the metal particles to a transfer surface and pressing the transfer surface against the substrate.

25. The method of claim 24 wherein the transfer surface has relief areas which will not contact the substrate, thereby transferring a pattern of metal particles.

26. The method of claim 1 wherein said contacting step and said heating step take place prior to said depositing step.

27. The method of claim 26 wherein said depositing step is followed by a subsequent pressing step of subjecting the particles on the substrate to a pressure and a temperature such that the adhesion of the particles to the substrate is increased.

28. The method of claim 27 wherein the temperature of said pressing step is lower than the temperature of said heating step.

29. The method of claim 1 wherein the substrate is coated with a solution of a polymer and said depositing step takes place while the polymer is still in a tacky state.

30. The method of claim 17 wherein the surface of the substrate is rendered tacky by the application of a solvent and said depositing step takes place while the polymer is still tacky.

31. The method of claim 1 wherein a metal layer has been deposited on two opposite surfaces of the substrate.

32. The method of claim 1 wherein tertiary amine also contains a hydroxyalkyl group.

33. The method of claim 32 wherein the tertiary amine is N,N-bis(2-hydroxyethyl)cocoamine or N,N-bis(2-hydroxyethyl)- tallow amine.

34. A method of forming a conductive metal layer on a substrate, comprising:
    a. a depositing step of depositing a layer of copper or nickel metal particles on a temporarily deformable substrate;
    b. a contacting step of contacting, in the absence of a binder, the metal particles with a developing agent comprising (i) a long-chain aliphatic tertiary amine; (ii) a tertiary phosphine or a tertiary phosphite; or (iii) a bifunctional compound being selected from the group consisting of diamines, alkanolamines, secondary amino alcohols, tertiary amino alcohols, secondary sulfides, hydrazides, hydrazones, oximes and di(hydroxyalkyl) tertiary amides and having both (1) a first atom which is a trivalent nitrogen atom or a bivalent sulfur atom and (2) at least one second atom which is nitrogen or oxygen; the first and second atoms being separated by at least two other atoms; the bifunctional compound being capable of forming a coordination complex with copper or nickel; and
    c. a heating step of subjecting the metal particles and the developing agent to heat, in the substantial absence of oxygen, at a temperature and for a duration sufficient to improve the conductivity of the metal 35. The method of claim 34 wherein said di(hydroxyalkyl) tertiary amide is a di(2-hydroxyethyl)alkyl amide having 5 to 20 carbons in the alkyl moiety.

36. The method of claim 35 wherein said di(2-hydroxyethyl)alkyl amide is di(2-hydroxyethyl)dodecanamide.

* * * * *